United States Patent
Minagawa (10) Patent No.: US 7,893,415 B2
(45) Date of Patent: Feb. 22, 2011

(54) OPTICAL SEMICONDUCTOR RELAY DEVICE FOR REDUCING TRANSIENT VOLTAGE BETWEEN OUTPUT TERMINALS OF THE RELAY AND MAINTAINING HIGH OPERATION SPEED AND LOW CAPACITANCE CHARACTERISTICS

(75) Inventor: Tomohiro Minagawa, Kawasaki (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/264,423

(22) Filed: Nov. 4, 2008

(65) Prior Publication Data

US 2009/0115490 A1    May 7, 2009

(30) Foreign Application Priority Data

Nov. 5, 2007  (JP) ............................. 2007-287459

(51) Int. Cl.
  *G02B 27/00* (2006.01)
  *H03K 3/42* (2006.01)
  *H03K 17/687* (2006.01)
(52) U.S. Cl. .................. 250/551; 327/515; 327/427
(58) Field of Classification Search ............. 250/551; 327/427, 428, 514, 515; 307/117; 361/173, 361/206, 207
See application file for complete search history.

(56) References Cited

U.S. PATENT DOCUMENTS

| 5,105,090 A | * | 4/1992 | Miyajima et al. | ............ 250/551 |
| 5,559,466 A | * | 9/1996 | Okumura et al. | ............ 327/514 |
| 6,172,552 B1 | | 1/2001 | Tamai et al. | |

FOREIGN PATENT DOCUMENTS

| JP | 04077015 A | * | 3/1992 |
| JP | 05-268042 A | | 10/1993 |
| JP | 3013894 B2 | | 12/1999 |
| JP | 2004-260047 A | | 9/2004 |

* cited by examiner

*Primary Examiner*—Thanh X Luu
(74) *Attorney, Agent, or Firm*—Sughrue Mion, PLLC (57) ABSTRACT

A transient voltage occurring between output terminals during ON/OFF operation is reduced. There are provided a pair of input terminals IN1 and IN2, a pair of output terminals OUT1 and OUT2, MOSFETs N1 and N2 connected between the output terminals, and a drive circuit 10 connected between the input terminals IN1 and IN2 and the MOSFETs N1 and N2. A light-emitting diode D1 is connected between the input terminals IN1 and IN2. The MOSFETs N1 and N2 have their source electrodes electrically connected to each other and their drains connected to the output terminals OUT1 and OUT2 respectively. The drive circuit 10 includes a photodiode array FD1 that supplies a drive voltage to the gates of the MOSFETs N1 and N2, and a discharge circuit 11, connected between the gate electrodes and the source electrodes of the MOSFETs N1 and N2, that discharges electric charges accumulated on each gate electrode.

12 Claims, 8 Drawing Sheets

OPTICAL SEMICONDUCTOR RELAY DEVICE FOR REDUCING TRANSIENT VOLTAGE BETWEEN OUTPUT TERMINALS OF THE RELAY AND MAINTAINING HIGH OPERATION SPEED AND LOW CAPACITANCE CHARACTERISTICS

REFERENCE TO RELATED APPLICATION

This application is based upon and claims the benefit of the priority of Japanese patent application No. 2007-287459, filed on Nov. 5, 2007, the disclosure of which is incorporated herein in its entirety by reference thereto.

FIELD OF THE INVENTION

The present invention relates to an optical semiconductor relay device, and particularly to an optical semiconductor relay device comprising a plurality of MOSFETs between its output terminals.

BACKGROUND OF THE INVENTION

As semiconductor devices have increasingly higher capacitances and faster operation speeds, the test time of semiconductor testers that test these devices is also required to become faster. Further, it is crucial that the optical semiconductor relay in the tester has a low capacitance and high operation speed. As means for achieving low capacitance and high operation speed characteristics in an optical semiconductor relay, various optical semiconductor relay devices are proposed (refer to Patent Documents 1, 2, and 3).

Figure 3:
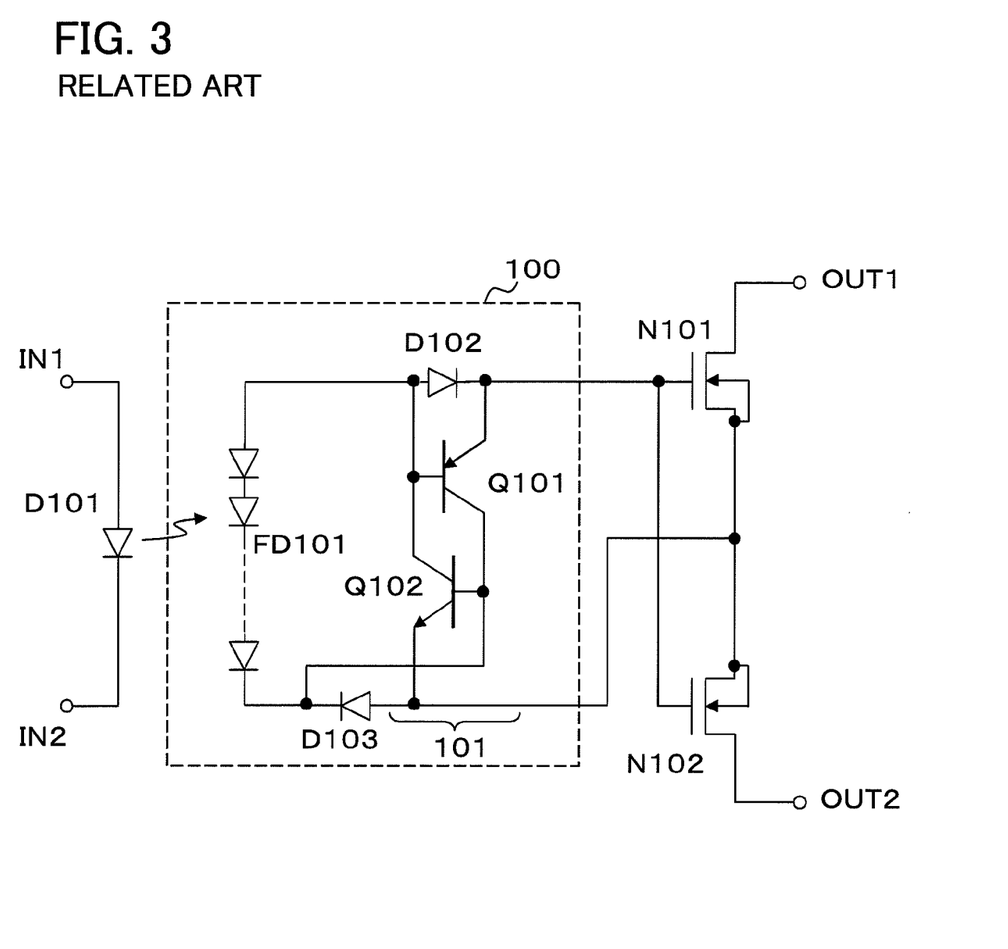
FIG. 3 is a circuit diagram of an optical semiconductor relay device of a first conventional type.

FIG. 3 is a circuit diagram of a solid-state relay of the type similar to these described in Patent Document 1 or a circuit diagram of an optically coupled relay device described in Patent Document 2 as a reference example. In FIG. 3, the optical semiconductor relay device comprises a pair of input terminals IN1 and IN2 and a pair of output terminals OUT1 and OUT2; a light-emitting diode (LED) that converts an input electrical signal supplied as a control signal into an optical signal is connected between the pair of the input terminals IN1 and IN2; and two MOSFETs N101 and N102 that turn on/off a load circuit connected externally are connected between the pair of the output terminals OUT1 and OUT2. Source electrodes and drain electrodes of the MOSFETs N101 and N102 are connected in anti-series (series in opposite direction) to each other so that the source electrodes are short-circuited with each other. The reason is as follows. In most cases, the optical semiconductor relay device has an AC signal flow between the output terminals OUT1 and OUT2, and in order to maintain an OFF state between the output terminals OUT1 and OUT2 in such cases, it is necessary to have a structure in which a reverse-blocking state can be bidirectionally maintained.

Further, a drive circuit 100 that drives the MOSFETs is provided between the LED D101 and the MOSFETs N101 and N102. The drive circuit 100 is formulated by a photodiode array FD 101 that receives light from LED D101 and converts it into an electrical signal, and a discharge circuit 101 provided so as to quickly discharge carriers accumulated on gate electrodes when the MOSFETs N101 and N102 perform an off-operation. The photodiode array FD11 is formulated by a plurality of photodiode elements connected in series and is characterized by an anode and a cathode of the photodiodes at both ends of the array.

Further, the discharge circuit 101 has a thyristor structure comprising a pnp transistor Q101 and an npn transistor Q102; a base electrode of the pnp transistor Q101 and the anode of the photodiode array FD11 are connected; and a base electrode of the npn transistor Q102 and the cathode of the photodiode array FD101 are connected. Further, diodes D102 and D103 that drive the pnp transistor Q101 and the npn transistor Q102, respectively, are connected between the base electrode and an emitter electrode of the respective transistor. The emitter electrode of the pnp transistor Q101 and a cathode of the diode D102 are connected to the gate electrodes of the MOSFETs N101 and N102, and the emitter electrode of the npn transistor Q102 and an anode of the diode D103 are connected to the source electrodes of the MOSFETs N101 and N102.

Next, the operation of the optical semiconductor relay device shown in FIG. 3 will be described. A current, as a control signal, flows between the anode and the cathode of the LED D101 constituting the input circuit. As a result, the LED D101 emits light, which is received by the photodiode array FD101. By receiving the light from the LED D101, the photodiode array FD101 generates a voltage, which causes a voltage exceeding a threshold voltage to be applied between the gate electrode and the source electrode of the MOSFETs N101 and N102 respectively. As a result, the MOSFETs N101 and N102 enter an ON state and so does the connection state between the output terminals OUT1 and OUT2. At this time, the discharge circuit 101, i.e., the thyristor, provided between the gate electrodes and the source electrodes of the MOSFETs N101 and N102, stays in an OFF state.

On the other hand, when no current is supplied to the LED D101, the photodiode array FD101 does not generate any voltage. At this time, the carriers accumulated on the gate electrodes of the MOSFETs N101 and N102 are urged to be discharged, however, since the diode D102 is connected reversely (as viewed from the gates of MOSFETs N101 and N102), only the leak current of the diode D102 and the thyristor (the pnp transistor Q101 and the npn transistor Q102) is discharged. Meanwhile, carrier recombination is under way inside the photodiode array FD101, which has lost the light, and the anode potential of the photodiode array FD101 decreases faster than the gate potential at the gate electrodes of the MOSFETs N101 and N102 does. As a result, when the potential difference between the anode potential of the photodiode array FD101 and the gate potential at the gate electrodes of the MOSFETs N101 and N102 exceeds the threshold voltage of the thyristor, the thyristor enters an ON state and the carriers accumulated on the gate electrodes of the MOSFETs N101 and N102 are discharged quickly via the thyristor. Further, when the gate-source voltage of the MOSFETs N101 and N102 becomes below the threshold voltage, the MOSFETs N101 and N102 enter an OFF state. As a result, the connection state between the output terminals OUT1 and OUT2 enters an OFF state.

Figure 4:
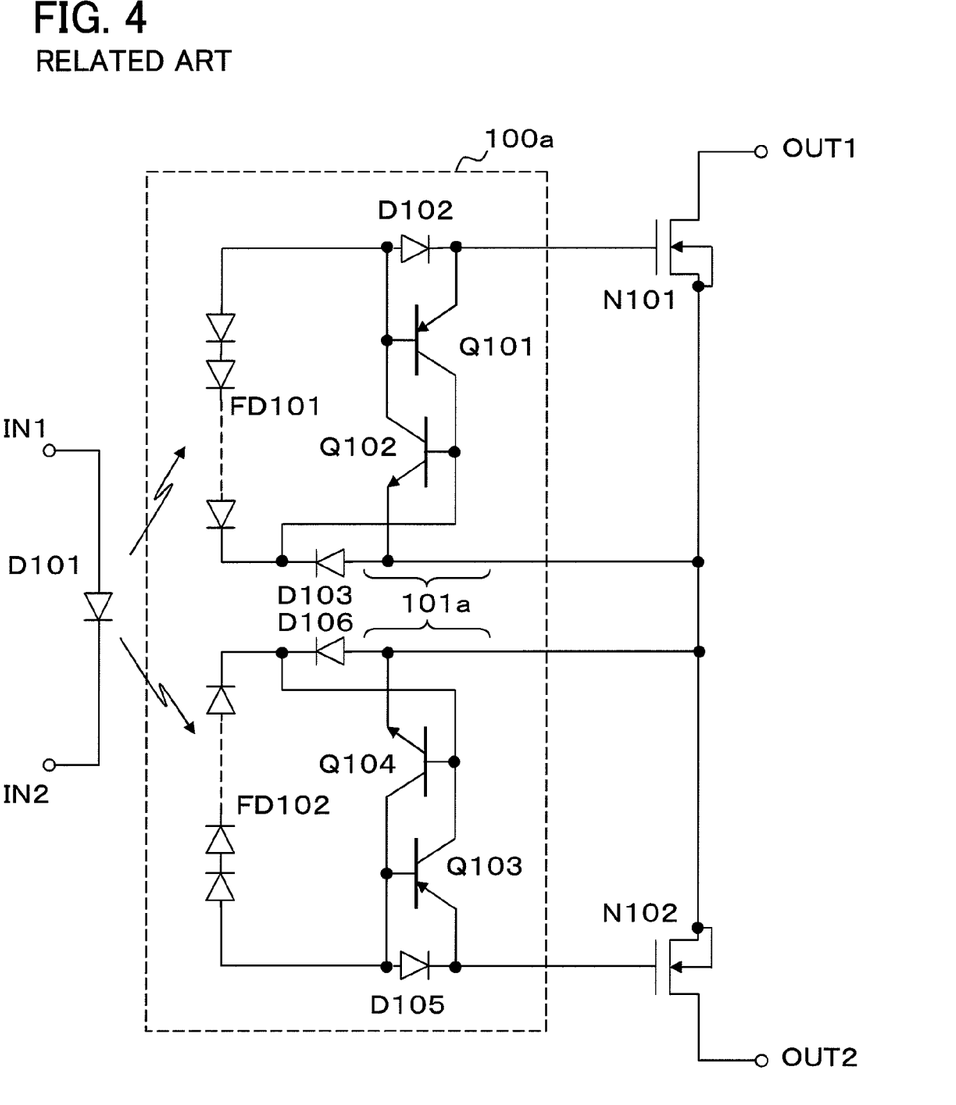
FIG. 4 is a circuit diagram of an optical semiconductor relay device of a second conventional type.

In the conventional optical semiconductor relay device of the type as shown in FIG. 3, the drive circuit is constituted by a single circuit (single-circuit type). On the other hand, an optical semiconductor relay device of the type according to Patent Document 3, shown in FIG. 4, is a two-circuit type in which each of the MOSFETs N101 and N102 has a respective drive circuit in order to achieve a higher operation speed and low capacitance and each gate electrode is not short-circuited. In other words, in FIG. 4, a drive circuit 100a comprises the drive circuit constituted by the photodiode array FD101, the pnp transistor Q101, the npn transistor Q102, and the diodes D102 and D103 for the MOSFET N101; and the drive circuit constituted by a photodiode array FD102, a pnp transistor Q103, an npn transistor Q104, and diodes D105 and D106 for the MOSFET N102. These two drive circuits are the same circuits as the drive circuit shown in FIG. 3 and they operate identically.

It should be noted again that it is crucial for an optical semiconductor relay device to have low capacitance and high operation speed characteristics. In order to achieve this, the photodiode array and the discharge circuit are constituted using two circuits in the conventional optical semiconductor relay device of the type as shown in FIG. 4, and by having the photodiodes FD101 and FD102 drive the MOSFETs N101 and N102 respectively, high operation speed can be achieved.

[Patent Document 1]
Japanese Patent Kokai Publication No. JP-A-5-268042
[Patent Document 2]
Japanese Patent Kokai Publication No. JP-P2004-260047A
[Patent Document 3]
Japanese Patent Publication No. JP3013894B

SUMMARY

The entire disclosures of Patent Documents 1 to 3 are incorporated herein by reference thereto.

The following analysis has been given according to the present invention.

The off-capacitance Cout1 between the output terminals in the optical semiconductor relay device shown in FIG. 3 can be expressed by the following formula.

$$Cout1=(CDS+CGD)/2+CPKG$$

Here, CDS denotes the capacitance between the drain electrode and the source electrode of the MOSFETs, and CGD denotes the capacitance between the gate electrode and the drain electrode of the MOSFETs. Further, CPKG denotes the capacitance of the package.

Meanwhile, in the two-circuit type optical semiconductor relay device shown in FIG. 4, the drive circuits constituted by the photodiode arrays and the thyristors are disposed in anti-series between the gate electrode of the MOSFET N101 and the gate electrode of the MOSFET N102. Therefore the off-capacitance Cout2 between the output terminals can be expressed by the following formula and is smaller than Cout1.

$$Cout2=\{CDS+(CGD\times CPVD)/(CGD+CPVD)\}/2+CPKG$$

Here, CPVD denotes the capacitance between the terminals of the drive circuits.

From the two formulas above, it is clear that the output capacitance can be reduced by using two drive circuits and disposing each drive circuit between the gate and source electrodes of the respective MOSFET.

The two-circuit type optical semiconductor relay device shown in FIG. 4 has the benefit of having a high operation speed and low output capacitance because of its circuit configuration. The present inventor, however, has discovered that a transient voltage tends to occur between the output terminals during the ON/OFF operation of a relay of such a two-circuit type optical semiconductor relay device.

Figure 5:
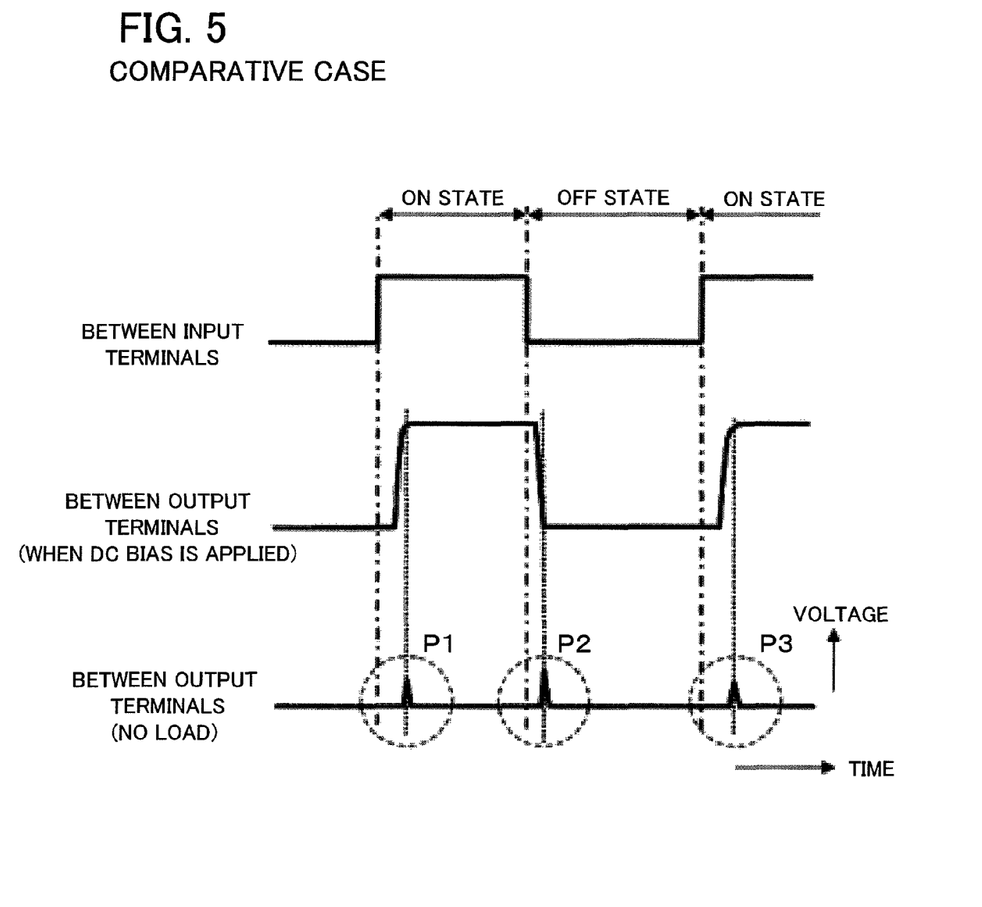
FIG. 5 is a comparative timing chart of voltages between each terminal during the ON/OFF operation of the second conventional optical semiconductor relay device.

How this transient voltage occurs will be explained. The comparative waveforms of voltages between the input terminals and the output terminals observed during the ON/OFF operation in the conventional two-circuit type optical semiconductor relay device are shown in FIG. 5. When no load is applied between the output terminals, as indicated by P1 to P3 in FIG. 5, transient voltages occur during the OFF to ON operation and ON to OFF operation of the MOSFETs. These transient voltages are mainly caused by the differences between various load states of each MOSFET, i.e., the variance in the turn-on time and the turn-off time of each MOSFET. In the two-circuit type device, variance in turn-on time may occur in the discharge circuits. This variance in turn-on time is caused by a difference in the amount of light received by each photodiode, a difference in output characteristics caused by the difference in responsiveness, a difference in threshold voltage between the discharge circuits (the thyristors), and a difference in carrier recombination speed between the photodiode arrays. As a result, the time it takes for each MOSFET to turn on/off tends to vary. This variance in time causes the transient voltages between the output terminals and these voltages may become the source of noise in other equipment and circuits.

On the other hand, in the conventional single-circuit type optical semiconductor relay device shown in FIG. 3, the ON/OFF operation of each MOSFET is performed using a single photodiode array and discharge circuit. Therefore, there is little variance in the turn-on time and turn-off time in each MOSFET, resulting in very little transient voltage between the output terminals. However, compared with the two-circuit type, it is inferior in terms of output capacitance characteristics and turn-on time speed.

There is provided an optical semiconductor relay device. According to an aspect of the present invention comprising: a pair of input terminals; a pair of output terminals; a plurality of FETs connected between the output terminals; and a drive circuit that drives the plurality of FETs. A single control signal is supplied to the pair of input terminals and a single output signal is outputted to the pair of output terminals. The plurality of FETs are the same type and have their source electrodes electrically connected to each other; the drive circuit is configured so that gate electrodes of the FETs are not electrically short-circuited to each other. The FETs are turned on/off by the single control signal. The drive circuit includes an optical/electrical transducer that supplies a drive voltage to the gates of the plurality of FETs, and a discharge circuit, connected between the gate electrodes and the source electrodes of the plurality of FETs. The discharge circuit discharges electric charges accumulated on each gate electrode.

The meritorious effects of the present invention are summarized as follows.

According to the present invention, a transient voltage occurring between output terminals during the ON/OFF operation of a relay can be greatly reduced while maintaining high operation speed and low capacitance characteristics.

PREFERRED MODES OF THE INVENTION

An optical semiconductor relay device relating to a mode of the present invention comprises a pair of input terminals, a pair of output terminals, a pair of MOSFETs connected between the output terminals, and a drive circuit connected between the pair of the input terminals and the pair of the MOSFETs. An LED is connected between the pair of the input terminals. Source electrodes of the MOSFETs are electrically connected to each other and drains are respectively connected to the pair of the output terminals. The drive circuit includes a photodiode array that receives light from the LED and applies a drive voltage to gates of the pair of the MOSFETs, and a discharge circuit, connected between the gate electrodes and the source electrodes of the pair of the MOSFETs, that discharges electric charges accumulated on each gate electrode.

The discharge circuit may comprise an npn transistor having its collector connected to an anode of the photodiode array, its base connected to a cathode of the photodiode array, and its emitter connected to the source electrodes of a plurality of FETs; a first pnp transistor having its emitter connected to the gate electrode of one of the plurality of FETs, its base connected to the anode of the photodiode array, and its collector connected to the cathode of the photodiode array; a second pnp transistor having its emitter connected to the gate electrode of the other FET, its base connected to the anode of the photodiode array, and its collector connected to the cathode of the photodiode array; a first diode group having its anode connected to the emitter of the npn transistor and its cathode connected to the base of the npn transistor; a second diode group having its anode connected to the base of the first pnp transistor and its cathode connected to the emitter of the first pnp transistor; and a third diode group having its anode connected to the base of the second pnp transistor and its cathode connected to the emitter of the second pnp transistor.

Further, in the optical semiconductor relay device, the first, the second, and the third diode groups may be constituted by a single diode or a plurality of diodes connected in series.

Further, in the optical semiconductor relay device, a first resistance element may replace the first diode group.

Further, in the optical semiconductor relay device, a second resistance element connected in parallel with the photo diode array may be provided.

Further, in the optical semiconductor relay device, a leakage diode having its cathode connected to the anode of the photodiode array and its anode connected to the cathode of the photodiode array may be provided.

In the optical semiconductor relay device described above, the plurality of FETs can be turned on/off almost simultaneously since only a single photodiode array and a single discharge circuit are provided for the plurality of FETs. As a result, high operation speed and low output capacitance characteristics can be achieved with very little transient voltage occurring between the output terminals during the ON/OFF operation of the relay. Furthermore, compared with the conventional two-circuit type optical semiconductor relay device, the circuit is simpler in structure.

The present invention will be described in detail using examples with reference to the drawings.

EXAMPLE 1

Figure 1:
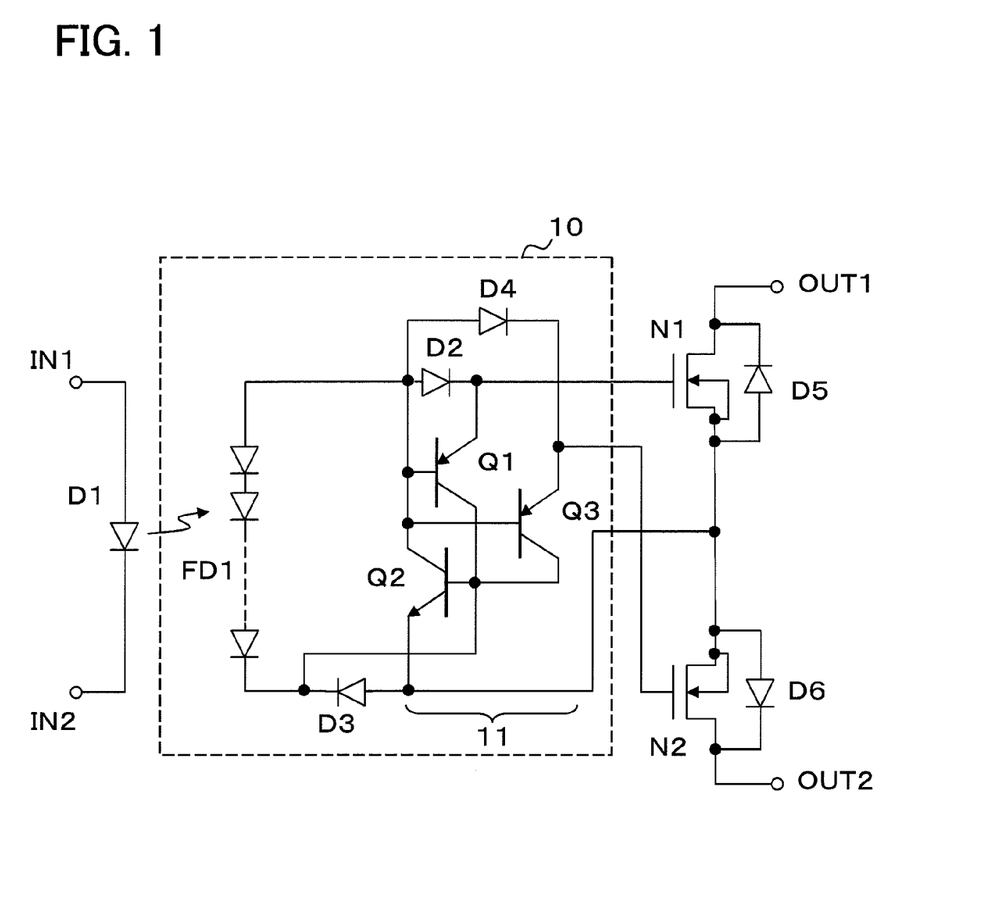
FIG. 1 is a circuit diagram of an optical semiconductor relay device according to a first exemplary example of the present invention.

FIG. 1 is a circuit diagram of an optical semiconductor relay device relating to a first example of the present invention. In FIG. 1, the optical semiconductor relay device comprises a pair of input terminals IN1 and IN2, a pair of output terminals OUT1 and OUT2, MOSFETs N1 and N2 connected between the output terminals, and a drive circuit 10 connected between the input terminals IN1 and IN2 and the MOSFETs N1 and N2. An LED D1 is connected between the input terminals IN1 and IN2. Source electrodes of the MOSFETs N1 and N2 are electrically connected to each other, and drains are connected to the output terminals OUT1 and OUT2, respectively. Further, diodes D5 and D6 denote parasitic diodes of the MOSFETs N1 and N2 respectively.

The drive circuit 10 is configured so that gate electrodes of the MOSFETs N1 and N2 are not short-circuited to each other and a single control signal turns on/off the MOSFETs N1 and N2. Further, the drive circuit 10 includes a photodiode array FD1 that applies a drive voltage to the gates of the MOSFETs N1 and N2, and a discharge circuit 11, connected between the gate electrodes and the source electrodes of the MOSFETs N1 and N2, that discharges each gate electrode.

The discharge circuit 11 comprises an npn transistor Q2, pnp transistors Q1 and Q3, and diodes D2 to D4. The npn transistor Q2 has its collector connected to an anode of the photodiode array FD1, its base connected to a cathode of the photodiode array FD1, and its emitter connected to the source electrodes of the MOSFETs N1 and N2. The pnp transistor Q1 has its emitter connected to the gate electrode of the MOSFET N1, its base connected to the anode of the photodiode array FD1, and its collector connected to the cathode of the photodiode array FD1. The pnp transistor Q3 has its emitter connected to the gate electrode of the MOSFET N2, its base connected to the anode of the photodiode array FD1, and its collector connected to the cathode of the photodiode array FD1. The npn transistor Q2 and the pnp transistor Q1 constitute a thyristor that functions as a discharge circuit and the npn transistor Q2 and the pnp transistor Q3 constitute another thyristor that functions as a discharge circuit.

The diode D3 has its anode connected to the emitter of the npn transistor Q2 and its cathode connected to the base of the npn transistor Q2. The diode D2 has its anode connected to the base of the pnp transistor Q1 and its cathode connected to the emitter of the pnp transistor Q1. The diode D4 has its anode connected to the base of the pnp transistor Q3 and its cathode connected to the emitter of the pnp transistor Q3.

Next, the operation of the optical semiconductor relay device configured as above will be described. When an input current as a control signal flows between the anode and the cathode of the LED D1 that constitutes the input circuit, the LED D1 emits light, which is received by the photodiode array D1. By receiving the light from the LED D1, the photodiode array FD1 generates a voltage, which causes carrier accumulation at the gate electrodes of the MOSFETs N1 and N2. At this time, the voltage is applied to the paths between the gate electrodes and the source electrodes of the MOSFETs N1 and N2 almost simultaneously and the MOSFETs N1 and N2 turn on almost simultaneously as soon as a voltage exceeding the threshold voltage of each MOSFET is applied. As a result, the output terminals OUT1 and OUT2 enter an ON state. At this time, the discharge circuit 11 provided between the gate electrodes and the source electrodes of the MOSFETs N1 and N2 stays in an OFF state.

Further, when the LED D1 stops receiving the current, the photodiode array FD1 stops generating the voltage. As a result, recoupling of carriers occurs inside the photodiode array FD1 that has lost the light and the anode potential of the photodiode array FD1 decreases more rapidly than the gate potential at the gate electrodes of the MOSFETs N1 and N2 does. Then, the thyristors enter an ON state when the potential difference between the anode potential of the photodiode array FD1 and the gate potential at the gate electrodes of the MOSFETs N1 and N2 exceeds the threshold voltages of the thyristor(s).

At this time, the npn transistor Q2 is shared by the thyristors. Therefore, when one of the thyristor enters an ON state, the other thyristor is turned on almost simultaneously and the electric charges accumulated on the gate electrodes of the MOSFETs N1 and N2 are rapidly discharged via the two thyristors almost simultaneously. In other words, when the pnp transistor Q1 enters an ON state first, the electric charges accumulated on the gate electrode of the MOSFET N1 are discharged and a current flows between the base and emitter of the npn transistor Q2 via the path between the emitter and the collector of the pnp transistor Q1. As a result, the npn transistor Q2 enters an ON state. Consequently, the pnp transistor Q3, which has been in an OFF state, is turned on immediately. Similarly, when the pnp transistor Q3 enters an ON state first, the pnp transistor Q1 is turned on almost simultaneously. Then, when the voltages between the gates and the sources of the MOSFETs N1 and N2 become below the threshold voltages of the MOSFETs N1 and N2, the MOSFETs N1 and N2 enter an OFF state.

In order to eliminate the factor causing the difference in turn-on time between the MOSFETs, i.e., the influence of the difference in the output characteristics between the photodiode arrays, in the conventional optical semiconductor relay device, only a single photodiode array is used and electric charges can be accumulated on the gate electrodes of the MOSFETs almost simultaneously in the present example. Therefore the difference in turn-on time between the MOSFETs is only caused by the difference in threshold voltage between them. The transient voltage that occurs between the output terminals is greatly reduced since, in most cases, MOSFET chips used in the optical semiconductor relay devices are adjacent chips on a wafer and there is little difference in threshold voltage among these MOSFET chips.

Having only a single photodiode array also eliminates a factor causing the difference in turn-off time between the MOSFETs, i.e., the difference in the speed of carrier recombination between the photodiode arrays. Furthermore, in order to eliminate another factor causing the difference in turn-off time between the MOSFETs, i.e., the influence of the difference in turn-on time between the discharge circuit, the single npn transistor is shared by the thyristors, therefore, after one of the thyristor has reached the threshold voltage and entered an ON state, the other thyristor is always turned on almost simultaneously. As a result, the gate charges of each MOSFET are rapidly discharged, and the path between the output terminals goes to an OFF state when the voltage decreases below the threshold voltage of each MOSFET.

As described, the difference in turn-off time between the MOSFETs is only caused by difference in threshold voltage between them. As a result, the transient voltage occurring between the output terminals is reduced greatly since there is little difference in threshold voltage among the MOSFETs used in a single optical semiconductor relay device.

EXAMPLE 2

Figure 2:
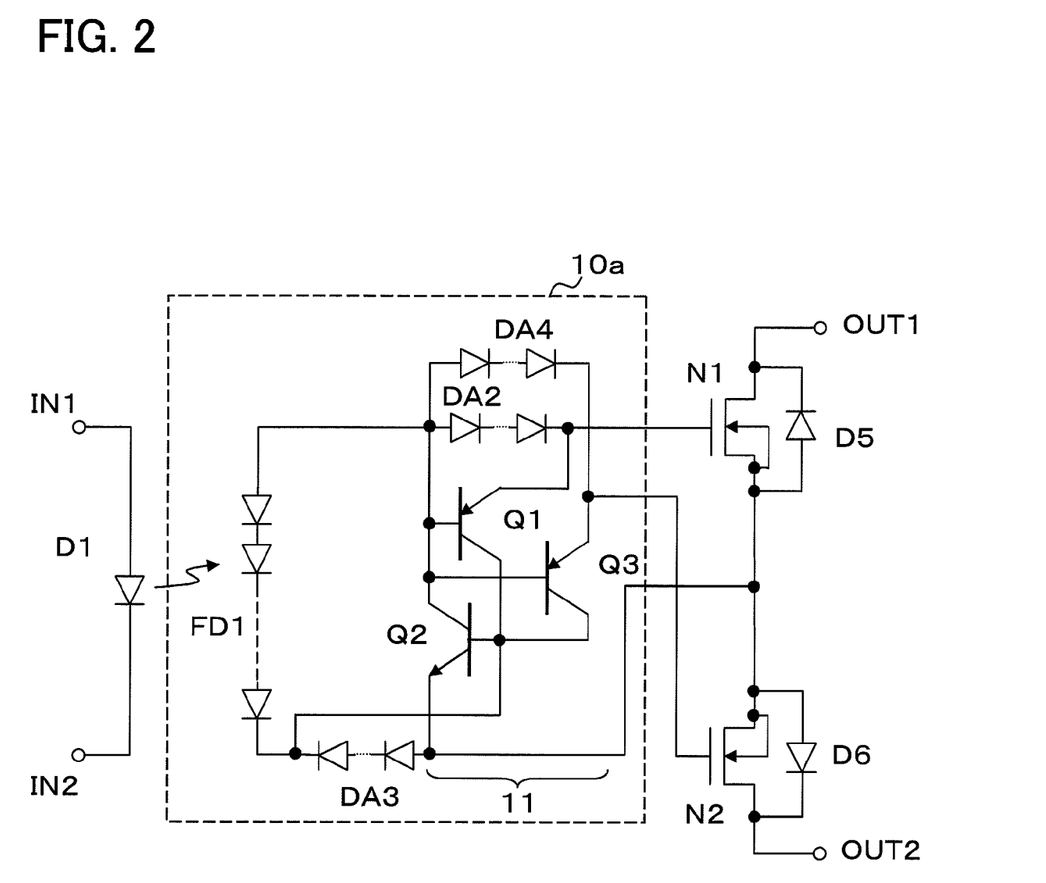
FIG. 2 is a circuit diagram of an optical semiconductor relay device according to a second exemplary example of the present invention.

FIG. 2 is a circuit diagram of an optical semiconductor relay device according to a second example of the present invention. In FIG. 2, the symbols same as the ones in FIG. 1 indicate the same things, thus the explanations of them will be omitted. In the optical semiconductor relay device shown in FIG. 2, the diodes D2 to D4 are replaced by serially-connected diode arrays DA2 to DA4 respectively.

In the optical semiconductor relay device configured as above, since the diode arrays DA2 to DA4, in which a plurality of diodes are connected in series, are used as the diodes connected between the base and emitter electrodes of each transistor in the thyristors as the discharge circuits, the OFF capacitance (CPVD) of the drive circuit constituted by the photodiode array and the discharge circuit is reduced more than in the first example. As a result, it is possible to reduce the OFF capacitance (Cout2) between the output terminals even more.

Figure 6:
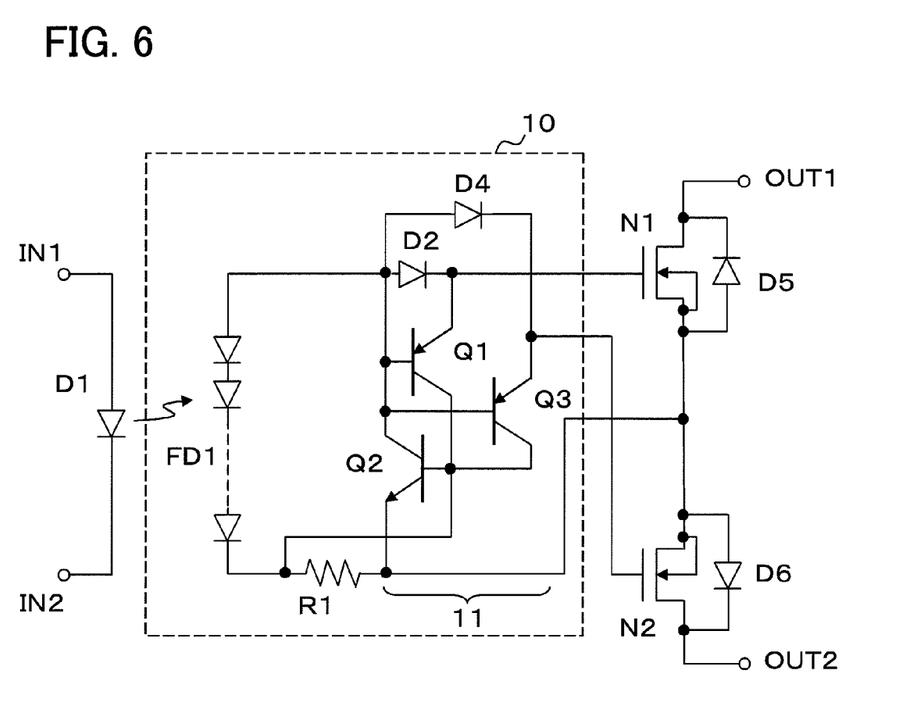
FIG. 6 is a circuit diagram of a variant of the exemplary examples of the present invention.

FIG. 6 shows a variant of the circuit of FIG. 1 or 2, in which a first resistance element R1 is used in place of the first diode group (D3 or DA3)

Figure 7:
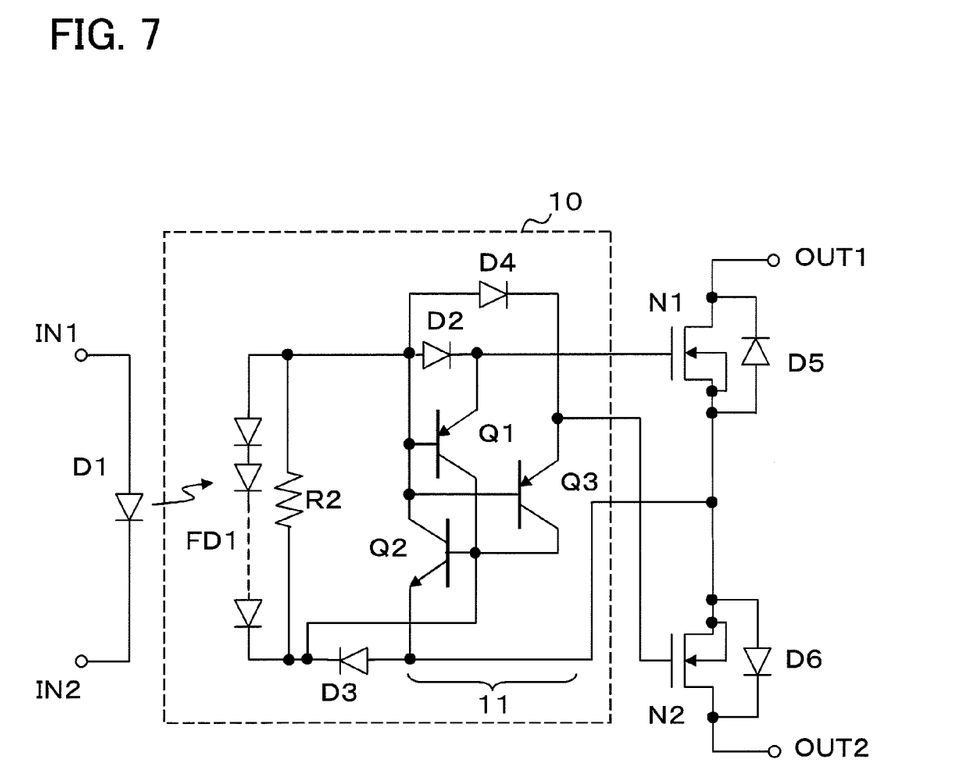
FIG. 7 is a circuit diagram of another variant of the exemplary examples of the present invention.

FIG. 7 shows another variant of the circuit of FIG. 1 or 2, or the circuit of FIG. 6, in which a second resistance element R2 is inserted in parallel to the photodiode array FD1 between the anode and cathode thereof.

Figure 8:
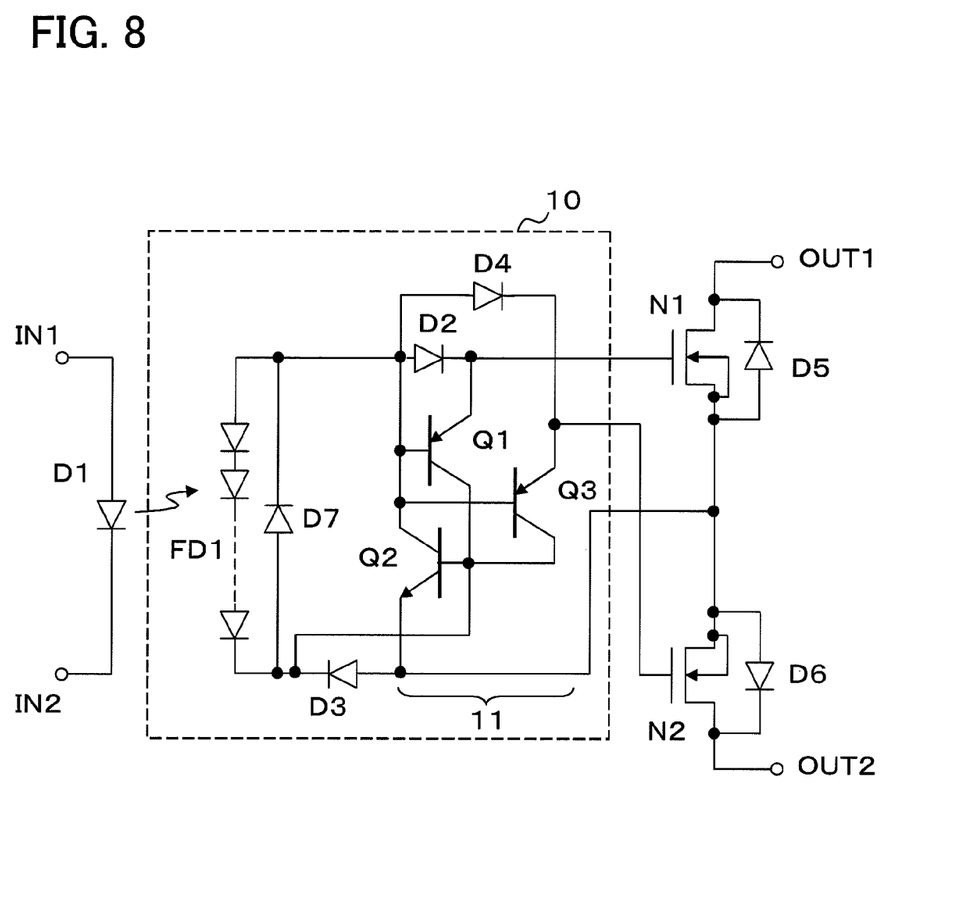
FIG. 8 is a circuit diagram showing a further variant of the exemplary examples of the present invention.

FIG. 8 shows a further variant of any of of the circuits of FIG. 1 or 2, and FIG. 6 or 7, in which a diode D7 for leakage is connected across the anode and cathode of the photodiode array FD1 in parallel therewith.

Each disclosure of the aforementioned Patent Documents is quoted in the present document and incorporated herein by reference thereto. Particularly, the disclosures of Patent Document 1 or 2 are referred to relating to the diode for leakage or use (insertion) of the resistance element, respectively.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An optical semiconductor relay device comprising:
   a pair of input terminals;
   a pair of output terminals;
   a plurality of FETs connected between said output terminals; and
   a drive circuit that drives said plurality of FETs; wherein
   a single control signal is supplied to said pair of input terminals and a single output signal is outputted to said pair of output terminals;
   said plurality of FETs are the same type and have their source electrodes electrically connected to each other;
   said drive circuit is configured so that gate electrodes of said FETs are not electrically short-circuited to each other;
   said FETs are turned on/off by said single control signal; and
   said drive circuit includes:
   an optical/electrical transducer that supplies a drive voltage to the gates of said plurality of FETs; and
   a discharge circuit, connected between the gate electrodes and the source electrodes of said plurality of FETs, that discharges electric charges accumulated on each gate electrode, wherein:
said optical/electrical transducer is a single continuous photodiode array,
said plurality of FETS include a first FET and a second FET,
a drain electrode of said first FET is connected to one of said output terminals, and
a drain electrode of said second FET is connected to the other of said output terminals.

2. The optical semiconductor relay device as defined in claim 1, wherein
said optical/electrical transducer is a photodiode array; and
said discharge circuit comprises:
an npn transistor having its collector connected to an anode of said photodiode array, its base connected to a cathode of said photodiode array, and its emitter connected to the source electrodes of said plurality of FETs;
a first pnp transistor having its emitter connected to the gate electrode of one of said plurality of FETs, its base connected to the anode of said photodiode array, and its collector connected to the cathode of said photodiode array;
a second pnp transistor having its emitter connected to the gate electrode of the other of said plurality of FETs, its base connected to the anode of said photodiode array, and its collector connected to the cathode of said photodiode array;
a first diode group having its anode connected to the emitter of said npn transistor and its cathode connected to the base of said npn transistor;
a second diode group having its anode connected to the base of said first pnp transistor and its cathode connected to the emitter of said first pnp transistor; and
a third diode group having its anode connected to the base of said second pnp transistor and its cathode connected to the emitter of said second pnp transistor.

3. The optical semiconductor relay device as defined in claim 2, wherein at least one of said first, second, and third diode groups comprises by a single diode or a plurality of diodes connected in series.

4. The optical semiconductor relay device as defined in claim 3 further comprising a second resistance element in parallel with said photodiode array.

5. The optical semiconductor relay device as defined in claim 3 further comprising a leakage diode having its cathode connected to the anode of said photodiode array and its anode connected to the cathode of said photodiode array.

6. The optical semiconductor relay device as defined in claim 2 comprising a first resistance element instead of said first diode group.

7. The optical semiconductor relay device as defined in claim 2 further comprising a second resistance element instead of said photodiode array.

8. The optical semiconductor relay device as defined in claim 2 further comprising a leakage diode having its cathode connected to the anode of said photodiode array and its anode connected to the cathode of said photodiode array.

9. The optical semiconductor relay device as defined in claim 1, wherein the drain electrode of each of the first and second FETs is not connected to a gate electrode, a source electrode and a drain electrode of the other one of the first and second FETs.

10. The optical semiconductor relay device as defined in claim 1, wherein said discharge circuit comprises a plurality of bipolar transistors.

11. The optical semiconductor relay device as defined in claim 1, wherein the drain electrode of said first FET is directly connected to said one output terminal, and the drain electrode of said second FET is directly connected to said other output terminal.

12. An optical semiconductor relay device comprising:
a pair of input terminals;
a pair of output terminals;
a plurality of FETs connected between said output terminals; and
a drive circuit that drives said plurality of FETs; wherein
said plurality of FETs are the same type and have their source electrodes electrically connected to each other;
said drive circuit is configured so that gate electrodes of said FETs are not electrically short-circuited to each other; and
said drive circuit includes:
an optical/electrical transducer that supplies a drive voltage to the gates of said plurality of FETs; and
a discharge circuit, connected between the gate electrodes and the source electrodes of said plurality of FETs, that discharges electric charges accumulated on each gate electrode,
wherein said discharge circuit comprises:
an npn transistor having its collector connected to an anode of said photodiode array, its base connected to a cathode of said photodiode array, and its emitter connected to the source electrodes of said plurality of FETs;
a first pnp transistor having its emitter connected to the gate electrode of one of said plurality of FETs, its base connected to the anode of said photodiode array, and its collector connected to the cathode of said photodiode array;
a second pnp transistor having its emitter connected to the gate electrode of the other of said plurality of FETs, its base connected to the anode of said photodiode array, and its collector connected to the cathode of said photodiode array,
wherein said optical/electrical transducer is a single continuous photodiode array.

* * * * *

UNITED STATES PATENT AND TRADEMARK OFFICE
CERTIFICATE OF CORRECTION

PATENT NO. : 7,893,415 B2
APPLICATION NO. : 12/264423
DATED : February 22, 2011
INVENTOR(S) : Tomohiro Minagawa Page 1 of 1

It is certified that error appears in the above-identified patent and that said Letters Patent is hereby corrected as shown below:

In the Claims

Column 9, Line 42: In Claim 4, after "element" insert -- connected --

Column 9, Line 53: In Claim 7, delete "instead of" and insert -- connected in parallel with --

Signed and Sealed this
Thirtieth Day of July, 2013

Teresa Stanek Rea
*Acting Director of the United States Patent and Trademark Office*